United States Patent
Shimada et al.

(10) Patent No.: US 9,664,410 B2
(45) Date of Patent: May 30, 2017

(54) RACK DEVICE, RACK SYSTEM, AND HOUSING STRUCTURE

(71) Applicant: FUJITSU LIMITED, Kawasaki-shi, Kanagawa (JP)

(72) Inventors: Shozo Shimada, Kawasaki (JP); Hideo Kamatani, Yokohama (JP); Daisaku Kanemoto, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/210,514

(22) Filed: Jul. 14, 2016

(65) Prior Publication Data

US 2016/0320090 A1    Nov. 3, 2016

Related U.S. Application Data

(63) Continuation of application No. 13/853,624, filed on Mar. 29, 2013.

(30) Foreign Application Priority Data

Apr. 24, 2012   (JP) ................. 2012-099266

(51) Int. Cl.
```
H05K 5/00       (2006.01)
F24F 13/32      (2006.01)
H05K 7/20       (2006.01)
H05K 5/02       (2006.01)
F24F 13/14      (2006.01)
```

(52) U.S. Cl.
CPC ............. *F24F 13/32* (2013.01); *F24F 13/14* (2013.01); *H05K 5/0213* (2013.01); *H05K 7/20* (2013.01); *H05K 7/20609* (2013.01); *H05K 7/20736* (2013.01); *H05K 7/20754* (2013.01)

(58) Field of Classification Search
CPC .................................. H05K 7/20754
USPC ............................................. 454/184
See application file for complete search history.

(56) References Cited

U.S. PATENT DOCUMENTS

| | | |
|---|---|---|
| 7,236,359 B2 | 6/2007 | Strobel |
| 8,724,315 B2 | 5/2014 | Branton |
| 2013/0037253 A1 | 2/2013 | Schneider et al. |

FOREIGN PATENT DOCUMENTS

| | | |
|---|---|---|
| JP | 10115478 A | 5/1998 |
| JP | 11-211322 A | 8/1999 |
| JP | 2007-335497 A | 12/2007 |

(Continued)

OTHER PUBLICATIONS http://www.kawamura.co.jp/datacom/sysrack/webC_tokutyou-scr.php, Apr. 24, 2012 pp. 1-3 (with English Translation).

(Continued)

*Primary Examiner* — Helena Kosanovic
(74) *Attorney, Agent, or Firm* — Oblon, McClelland, Maier & Neustadt, L.L.P.

(57) ABSTRACT

A rack device includes a housing at which an electronic device and an air conditioner are installed; a partition plate that divides a space in the housing into a first space in which the electronic device is disposed and a second space in which the air conditioner is disposed; and a shielding member that divides the second space into a space in which an outlet of the air conditioner is disposed and which is coupled to a suction side of the electronic device in the first space and a space in which an inlet of the air conditioner is disposed and which is coupled to a discharge side of the electronic device in the first space.

10 Claims, 10 Drawing Sheets

(56) References Cited

FOREIGN PATENT DOCUMENTS

| JP | 2010-175210 A | 8/2010 |
| JP | 2010-245201 A | 10/2010 |
| WO | WO 2011/107329 A1 | 9/2011 |

OTHER PUBLICATIONS

Combined Chinese Office Action and Search Report issued May 5, 2015 in Patent Application No. 201310138926.2 (with English Translation).
Notification of Reasons for Refusal issued Jan. 5, 2016 in Japanese Patent Application No. 2012-099266 (with partial English language translation).
English translation of the abstract in JP 10115478 A.

RACK DEVICE, RACK SYSTEM, AND HOUSING STRUCTURE

CROSS-REFERENCE TO RELATED APPLICATION

This continuation application is based upon and claims the benefit of U.S. patent application Ser. No. 13/853,624, filed Mar. 29, 2013, which is based upon and claims priority of the prior Japanese Patent Application No. 2012-099266, filed on Apr. 24, 2012, the entire contents of which are incorporated herein by reference.

FIELD

The embodiment discussed herein is related to a rack device, a rack system, and a housing structure.

BACKGROUND

In a rack device where an electronic device is installed, heat that is generated by the electronic device causes the temperature in the interior of the rack device to increase. When the temperature in the interior of the rack device is increased, the operation of the electronic device may become unstable. Therefore, air in the interior of the rack device is cooled.

In recent years, in order to cool the interior of rack devices, rack devices that are provided with air conditioning capability are being developed. The air-conditioning capability of such rack devices causes the internal temperatures of the rack devices to be stabilized, as a result of which the operations of electronic devices installed in such rack devices are stabilized.

With regard to such rack devices including an air-conditioning unit, a related art of cooling an electronic device by circulating air using an air conditioner that is disposed at a lower portion of the rack device exists. As an example of the related art, "coolrack" presented by Kawamura Electric Inc. in 2011 (Internet<URL: http://www.kawamura.co.jp/catalog/index05.php?topic=index08.html|%83%89%83b%83N|%94M%91%CE%8D%F4%83%89%83b%83N&category=TYPE-SCR>) is disclosed.

SUMMARY

According to an aspect of the invention, a rack device includes a housing at which an electronic device and an air conditioner are installed; a partition plate that divides a space in the housing into a first space in which the electronic device is disposed and a second space in which the air conditioner is disposed; and a shielding member that divides the second space into a space in which an outlet of the air conditioner is disposed and which is coupled to a suction side of the electronic device in the first space and a space in which an inlet of the air conditioner is disposed and which is coupled to a discharge side of the electronic device in the first space.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Space in which a rack device is capable of being installed is often limited. In particular, when a rack device is to be disposed at a school office or a business firm office, the space in which the rack device is capable of being disposed is even more limited. Therefore, it is desirable to effectively use the office space by reducing the space occupied by the rack device as a result of making the rack device more compact. Consequently, it is desirable to also further reduce the size of a rack device that is provided with air conditioning capability. It is possible to limit manufacturing costs by reducing the size of the rack device.

When a rack device is provided with air conditioning capability, the rack device includes a space where an air conditioner is installed in addition to a space where an electronic device is installed in a housing. Therefore, in order to reduce the size of the rack device, a compact air conditioner is used as one that is installed in the interior of the rack device. However, such a compact air conditioner itself lacks space for allowing excess heat to escape. Therefore, when the compact air conditioner is installed in the rack device without any gap, the heat of the air conditioner itself may influence the electronic device that is installed in the rack device. Consequently, in order to install such a compact air conditioner in the rack device, space is provided around the air conditioner.

If space is provided around the air conditioner, when, for example, a related art is used, an outlet and an inlet of the air conditioner exist in the same space, as a result of which, for example, a mixture of warmed air and cooled air is generated. This may reduce cooling efficiency.

An embodiment of a rack device, a rack system, and a housing structure that are disclosed in the present application will be described in detail below on the basis of the drawings. The embodiment below does not limit the rack device, the rack system, and the housing structure that are disclosed in the present application.

First Embodiment

Figure 1:
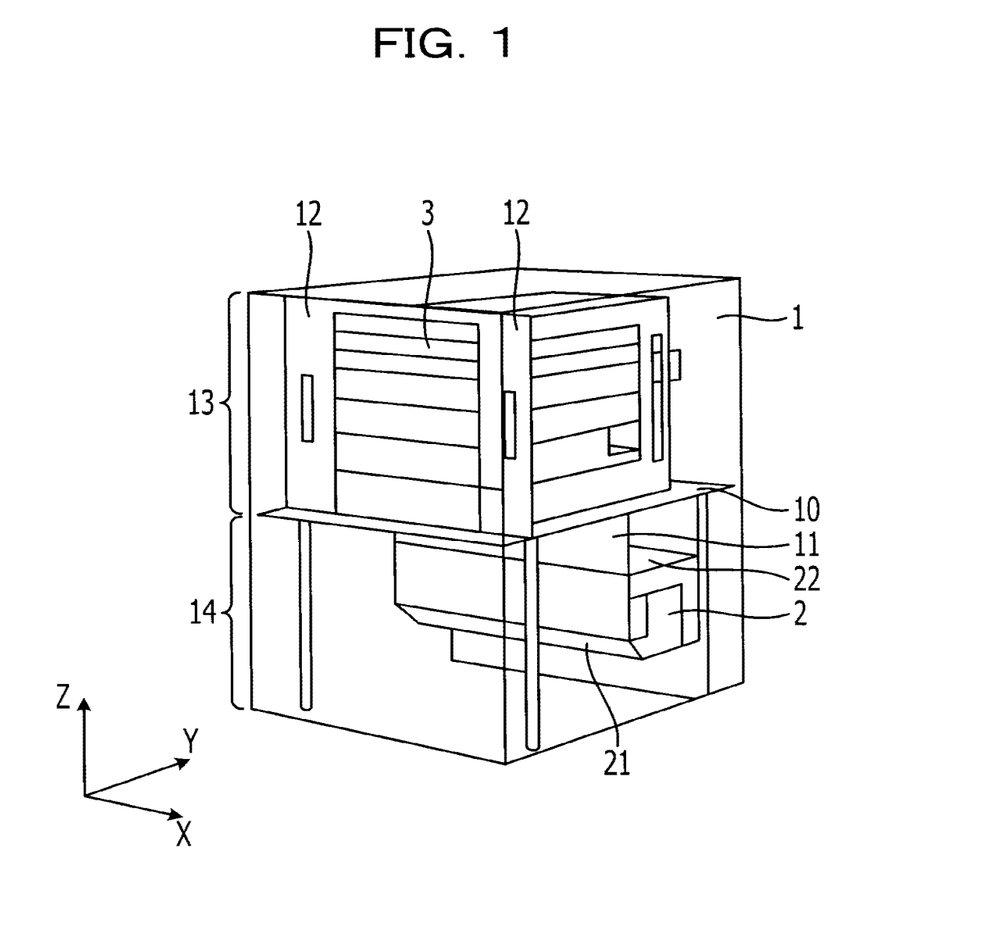
FIG. 1 is a perspective view of a rack device according to an embodiment.

FIG. 1 is a perspective view of a rack device according to an embodiment. As illustrated in FIG. 1, a housing 1 has a rectangular parallelepiped shape including an XY plane, a YZ plane, and an XZ plane. The housing 1 is disposed while the XY plane contacts the floor or while movement parts (such as a caster and a stopper), mounted to the XY plane of the housing 1, contact the floor. Hereunder, an X direction corresponds to a widthwise direction of the housing 1, a Y direction corresponds to a depth direction of the housing 1, and a Z direction corresponds to a height direction of the housing 1. The direction of arrow Z in FIG. 1 corresponds to an upward direction, and a direction opposite to the direction of arrow Z in FIG. 1 corresponds to a downward direction. The direction of arrow Y corresponds to a backward direction, and a direction opposite to the direction of arrow Y corresponds to a forward direction. The front side of the housing 1 corresponds to the front of the housing 1. The direction of arrow X corresponds to a rightward direction, and a direction opposite to the direction of arrow X corresponds to a leftward direction.

As illustrated in FIG. 1, the housing 1 includes an upper space 13 and a lower space 14, which are divided from each other by a partition plate 10. An electronic device 3 is installed in the upper space 13 of the housing 1. The electronic device 3 is, for example, a server or a networking device. An indoor unit of an air conditioner 2 is installed in the lower space 14 of the housing 1. Here, the air conditioner 2 according to the embodiment is divided into the indoor unit and an outdoor unit. The indoor unit is installed in the housing 1 of the rack device. The outdoor unit is placed outside the office where the rack device is set. In the description below, the indoor unit of the air conditioner 2 may be called the "air conditioner 2". The air conditioner 2 has an inlet 22 in its upper portion and an outlet 21 in its lower front portion. The upper space 13 is an exemplary first space. The lower space 14 is an exemplary second space.

A shielding plate 11 is disposed so as to extend towards the air conditioner 2 from the partition plate 10. The shielding plate 11 contacts both side surfaces of the housing 1 and contacts the air conditioner 2, so that, as described below, a space where the inlet 22 of the air conditioner 2 is disposed and a space where the outlet 21 is disposed are divided from each other. Further, a left side partition plate 12 and a right side partition plate 12 are disposed at the front side of a portion where the electronic device 3 is installed in the upper space 13 of the housing 1.

The electronic device 3 is disposed by being inserted in the depth direction from the front of the housing 1. The electronic device 3 sucks air from the front side of the interior of the housing 1 to cool various heating members, disposed in the interior of, for example, a central processing unit (CPU), using the sucked air. The electronic device 3 discharges the warmed air towards the back side of the interior of the housing 1.

The rack device is such that an outer wall at, for example, a door is provided along the periphery of the housing 1. The interior of the rack device is hermetically sealed. Since the interior of the rack device is hermetically sealed, cool air that is discharged from the air conditioner 2 and warm air that is discharged from the electronic device 3, described below, circulate without leaking to the outside of the rack device. This makes it possible to suppress a rise in temperature in an office occurring when the warm air leaks to the outside of the rack device. In addition, it is possible to increase cooling efficiency using the cooled air. Further, it is possible to suppress entry of, for example, dust that exists outside the housing 1.

Figure 2:
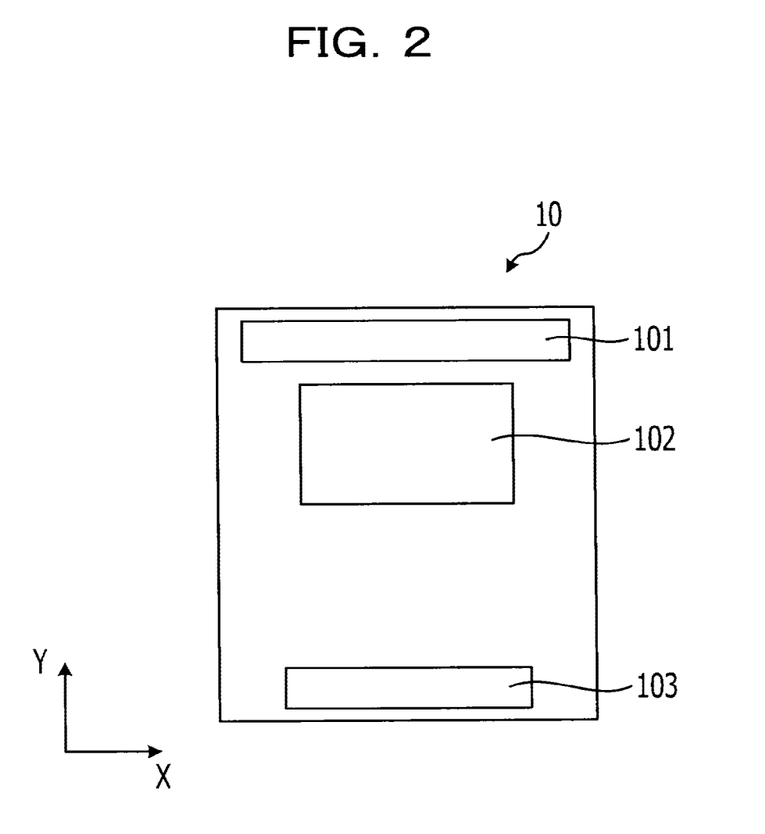
FIG. 2 is a schematic plan view of a partition plate.

FIG. 2 is a schematic plan view of the partition plate 10. The partition plate 10 has an outlet 101 at the back side of the housing 1. The partition plate 10 also has an outlet 102 in front of the outlet 101. The partition plate 10 has an inlet 103 at the front side of the housing 1. Here, discharge from the outlet 101, discharge from the outlet 102, and suction at the inlet 103 are called thus with reference to the electronic device 3. The term "discharge" refers to the discharge of warm air from the electronic device 3. The term "suction" refers to the suction of cool air by the electronic device 3. That is, air that is discharged from the back side of the electronic device 3 passes through the outlet 101 and is sent to the lower space 14 of the housing 1. Air that is warmed by heat at a central portion of the electronic device 3 passes through the outlet 102 and is sent to the lower space 14 of the housing 1. Air in the lower space 14 of the housing 1 passes through the inlet 103, is sent to the upper space 13, and is sucked by the electronic device 3.

In the embodiment, the opening of the inlet 103 is smaller than that of the outlet 101. A discharge opening section includes the outlet 101 and the outlet 102. A suction opening section only includes the inlet 103. Even if the entire suction opening section is viewed, the discharge opening section is larger than the suction opening section. When the inlet 103 is made small, it is possible to increase the pressure at the inlet-103 side of the lower space 14, increase the speed of air that is ejected towards the upper space 13 from the inlet 103, and increase the air volume. It is desirable that the cool air reach the electronic device 3, which is installed at a topmost portion in the housing 1, by ejecting air towards the upper space 13 from the inlet 103. It is desirable that the air volume of the cool air be a sufficient volume to allow the cool air to circulate around the entire electronic device 3 that is installed. Therefore, it is desirable that the size of the inlet 103 be determined in accordance with, for example, the size of the housing 1 on the basis of, for example, the relationship between the air speed and the air volume.

The length of the body of a networking device is less than that of, for example, a server or a storage. Therefore, discharge from the networking device is performed at the location of the outlet 102. Consequently, when the networking device is installed in the upper space 13 directly above the partition plate 10 or when only the networking device is installed in the upper space 13, warm air is sent to the lower space 14 from the outlet 102, so that it is possible to increase cooling efficiency.

Figure 3:
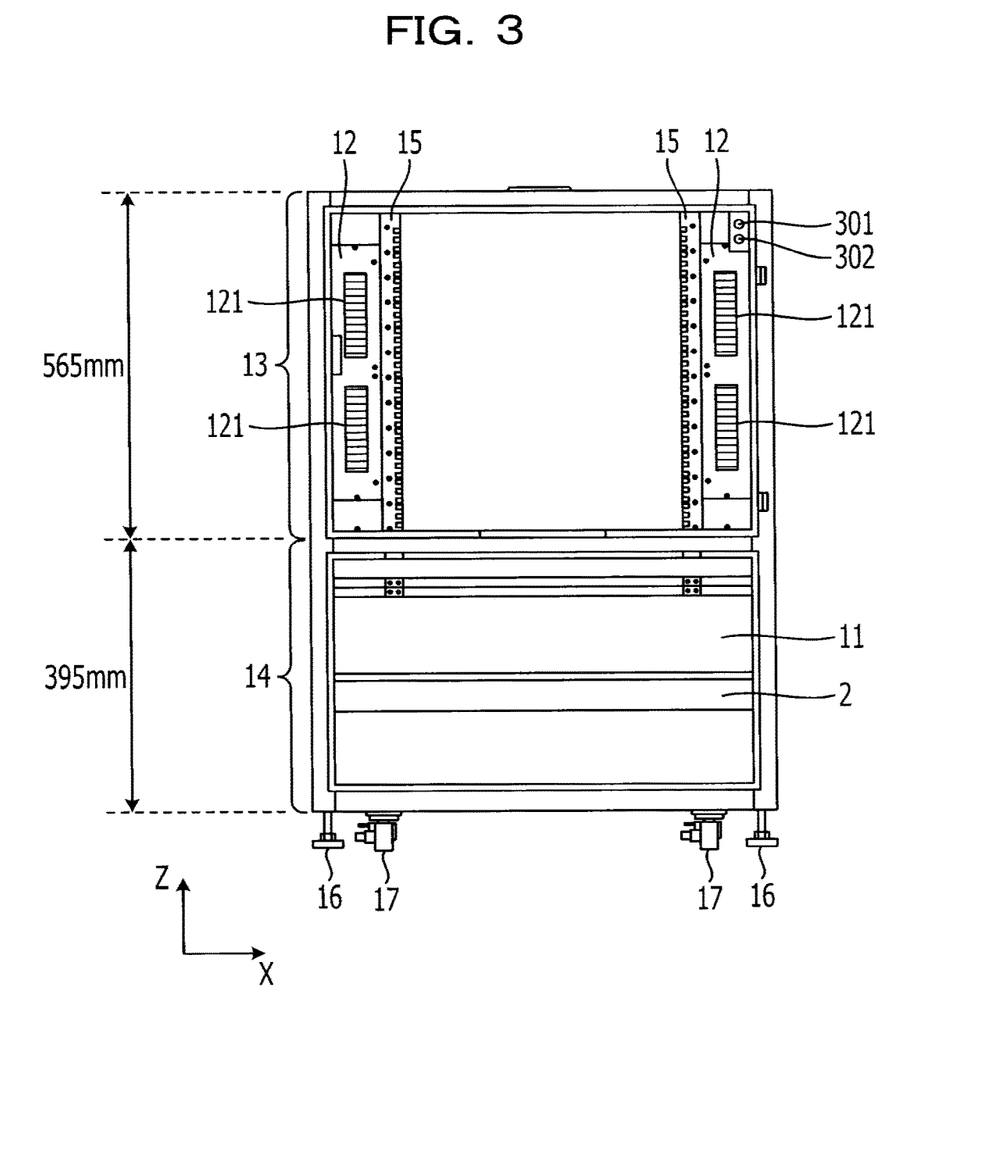
FIG. 3 is a front view of the rack device according to the embodiment.

FIG. 3 is a front view of the rack device according to the embodiment. In the embodiment, the rack device is described taking a rack device 12(U) as an example. FIG. 3 illustrates a state in which the electronic device 3 is not installed in the upper space 13. For example, the height of the upper space 13 is 565 mm. For example, the height of the lower space 14 is 395 mm. In FIG. 3, the housing 1 is fixed with a stopper 16 and a caster 17 that are in contact with the floor.

In front view, the side partition plates 12 are disposed on the left side and right side of the upper space 13. The side partition plates 12 extend from left and right sides of the housing 1 to the positions of columns that secure the electronic device 3, and divide a space at a suction-side of the electronic device 3 and a space at a discharge-side of the electronic device 3 from each other. The side partition plates 12 block the movement of air that is warmed by heat generated at the electronic device 3 so that the warmed air does not flow to the suction side of the electronic device 3. The distance between the columns that secure the electronic device 3 is, for example, 451 mm.

The side partition plates 12 each include heat-return suppressing panels 121. Each heat-return suppressing panel 121 is a resilient member including a plurality of cut-in portions. Cables connected to the front side of the electronic device 3 pass the cut-in portions of the heat-return suppressing panels 121, and are brought to the back side of the electronic device 3. Each heat-return suppressing panel 121 has, for example, a rectangular shape that measures 35 mm by 150 mm as viewed from the front of the housing 1. A mount angle 15 that secures the electronic device 3 is provided at an inner side of its corresponding side partition plate 12. Each mount angle 15 has holes that are arranged side by side in a vertical direction and that are provided for securing the electronic device 3 at a suitable position.

In FIG. 3, the outlet 21 of the air conditioner 2 and the shielding plate 11 are seen in the lower space 14. The shielding plate 11 extends along the front side of the air conditioner 2. The outlet 21 of the air conditioner 2 is exposed at the lower side of the shielding plate 11. As described below, the shielding plate 11 is capable of being lifted towards the front side.

Figure 4:
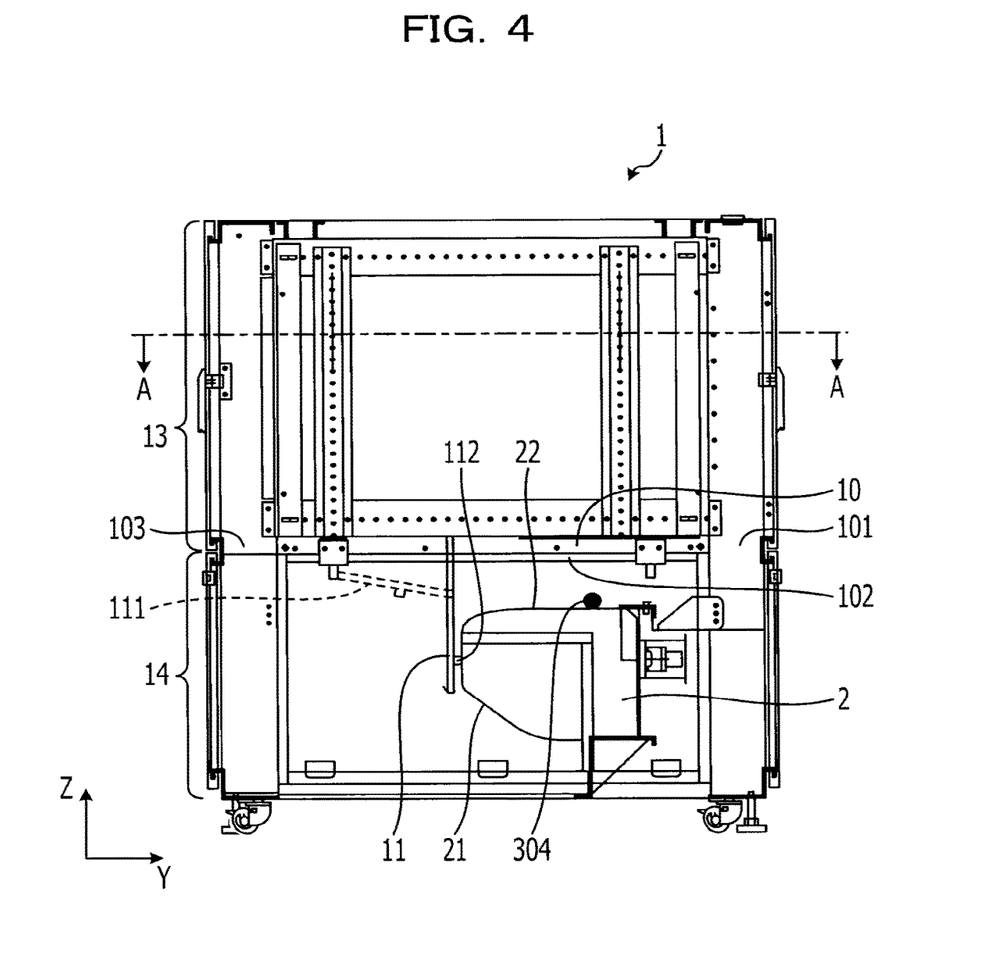
FIG. 4 is a sectional side view of the rack device according to the embodiment.
Figure 5:
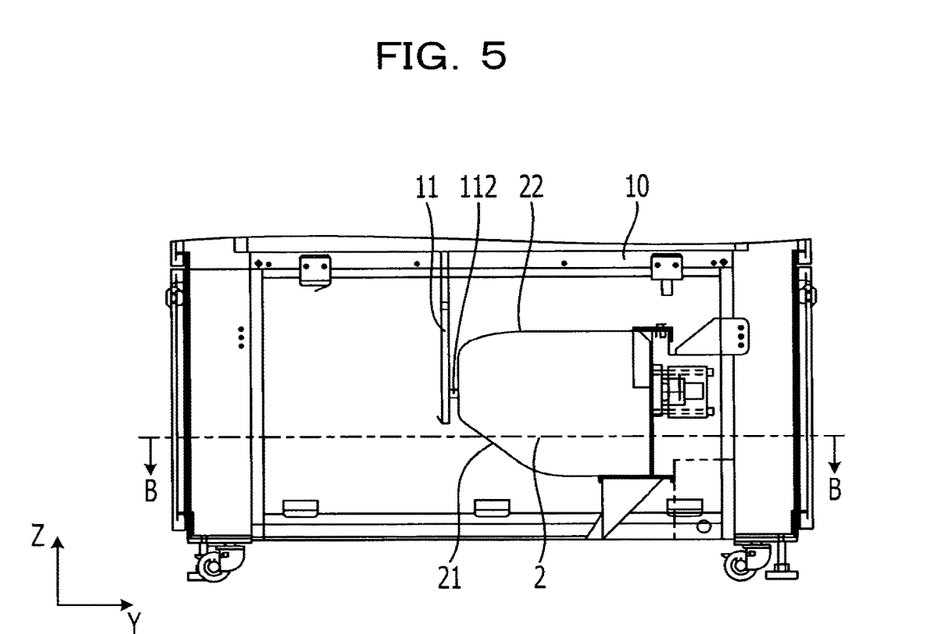
FIG. 5 is an enlarged side sectional view of a lower space.

FIG. 4 is a sectional side view of the rack device according to the embodiment. FIG. 5 is an enlarged side sectional view of the lower space 14.

As illustrated in FIGS. 4 and 5, the air conditioner 2 is disposed at the back side of the lower space 14. The air conditioner 2 may use, for example, an indoor unit of a household air conditioner. In the embodiment, as illustrated in FIG. 5, the air conditioner 2 has the outlet 21 at its lower front portion and the inlet 22 at its upper portion. The air conditioner 2 cools air sucked from the inlet 22, and discharges the cooled air from the outlet 21. It is desirable that the direction in which the cool air is discharged from the outlet 21 be set as appropriate so that the air volume from the inlet 103 is increased.

Space is also provided above the air conditioner 2 in the embodiment. This space is provided for, for example, sucking air from the inlet 22, provided at the upper portion of the air conditioner 2, and allowing heat of the air conditioner 2 to escape. In the embodiment, space is also provided below the air conditioner 2. However, the air conditioner 2 may be disposed in contact with the bottom surface of the housing 1. In this case, it is desirable that the direction in which air is discharged from the air conditioner 2 not correspond to the direction towards the bottom surface of the housing 1.

Figure 6:
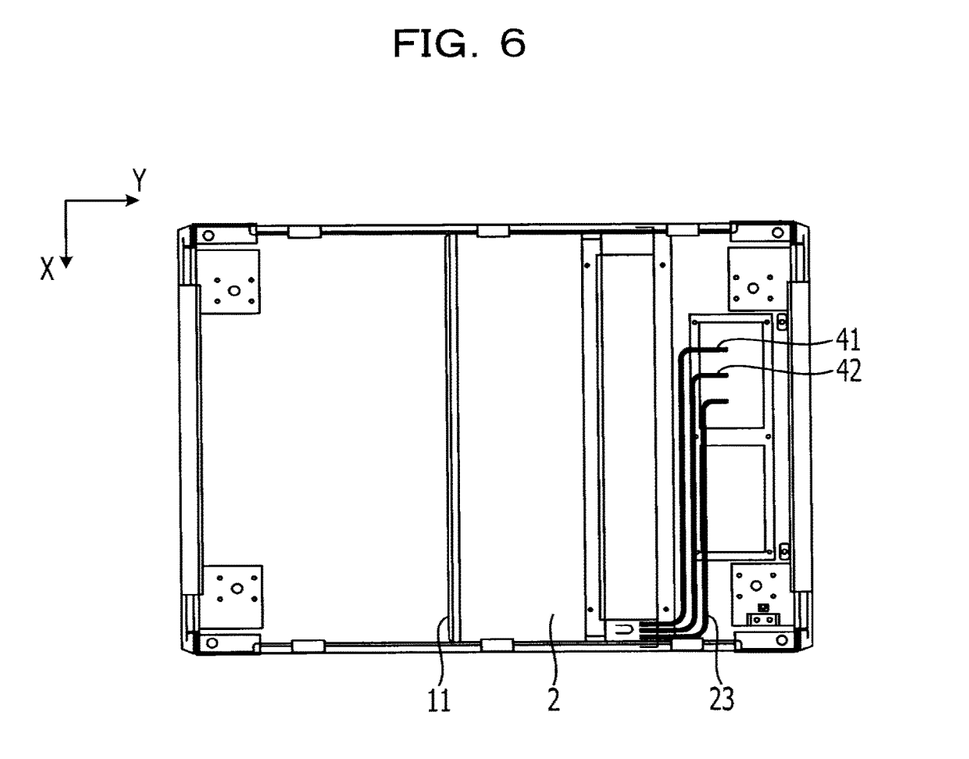
FIG. 6 is a sectional view taken along arrows B-B in FIG. 5.

Although not illustrated in FIG. 5, a drain hose extends to the outside from the air conditioner 2. The air conditioner 2 generates moisture primarily at the start of operation of the air conditioner 2. The drain hose drains away the moisture generated at the air conditioner 2 to a drain. FIG. 6 is a sectional view taken along arrows B-B in FIG. 5. For example, a drain hose 23 that extends out from the air conditioner 2 is led to an outside drain from the back side of the bottom surface of the housing 1. Refrigerant pipes 41 and 42 extending from the air conditioner 2 are led to the outside from the back side of the bottom surface of the housing 1, and are connected to an outdoor unit 4.

Here, in the embodiment, the air conditioner 2 is disposed in the lower space 14. This makes it possible to dispose the electronic device 3 in the upper space 13, so that it is possible to easily perform maintenance of the electronic device 3. Even if water leakage caused by moisture generated at the air conditioner 2 occurs, it is possible to reduce the effect of the water leakage on the electronic device 3.

The shielding plate 11 extends downward from the partition plate 10 and is disposed so as to contact a front portion of the air conditioner 2. The shielding plate 11 rotates around an axis in the widthwise direction of the housing 1 up to a position that is reached in a state illustrated by a dotted line 111 in FIG. 4. The shielding plate 11 is secured in the state illustrated by the dotted line 111. For example, when a fitting member is provided at an end of the shielding plate 11 and a fitting member that forms a set with the fitting member of the shielding plate 11 is provided at a position of the partition plate 10 where the end of the shielding plate 11 contacts the partition plate 10, it is possible to secure the shielding plate 11 using the fitting members. When a magnet is disposed at the end of the shielding plate 11 and a magnet is disposed at the location of the partition plate 10 where the end of the shielding plate 11 contacts the partition plate 10, by rotating the shielding plate 11 to the position illustrated by the dotted line 111, it is possible to secure the shielding plate 11 by magnetic force. By rotating the shielding plate 11 in this way, it is easy to access the air conditioner 2 from the front side of the housing 1. For example, in the embodiment, by rotating the shielding plate 11, it is possible to open the cover at the front side of the air conditioner 2 and easily clean the interior of the air conditioner 2.

The shielding plate 11 divides a space where cool air that is discharged from the outlet 21 of the air conditioner 2 accumulates and a space where warm air that is discharged from the electronic device 3 and that is sucked from the inlet 22 of the air conditioner 2 accumulates from each other. By providing the shielding plate 11 in this way, even if space is provided around the air conditioner 2 and the air conditioner 2 is disposed in the interior of the housing 1, it is possible to separate the warm air and the cool air from each other, so that it is possible to increase cooling efficiency.

As illustrated in FIG. 5, the shielding plate 11 extends along a wall of the air conditioner 2 and up to a location near the outlet 21. The wall of the air conditioner 2 extends parallel to front and back surfaces of the rack device, and from the outlet 21 towards the partition plate 10. Further, in the embodiment, a cushioning material 112, such as a sponge, is disposed at a surface of the shielding plate 11 that contacts the air conditioner 2. When the cushioning material 112 is sandwiched by the shielding plate 11 and the air conditioner 2, it is possible to reduce the air volume that passes through a gap between the shielding plate 11 and the air conditioner 2. In addition, it is possible to more reliably block warm air near the inlet 22 and cool air near the outlet 21 compared to when the shielding plate 11 is merely disposed in contact with the air conditioner 2. By causing the shielding plate 11 to contact the air conditioner 2 with the cushioning material 112 being disposed therebetween, it is possible to suppress rattling caused by the operation of the air conditioner 2.

Figure 7:
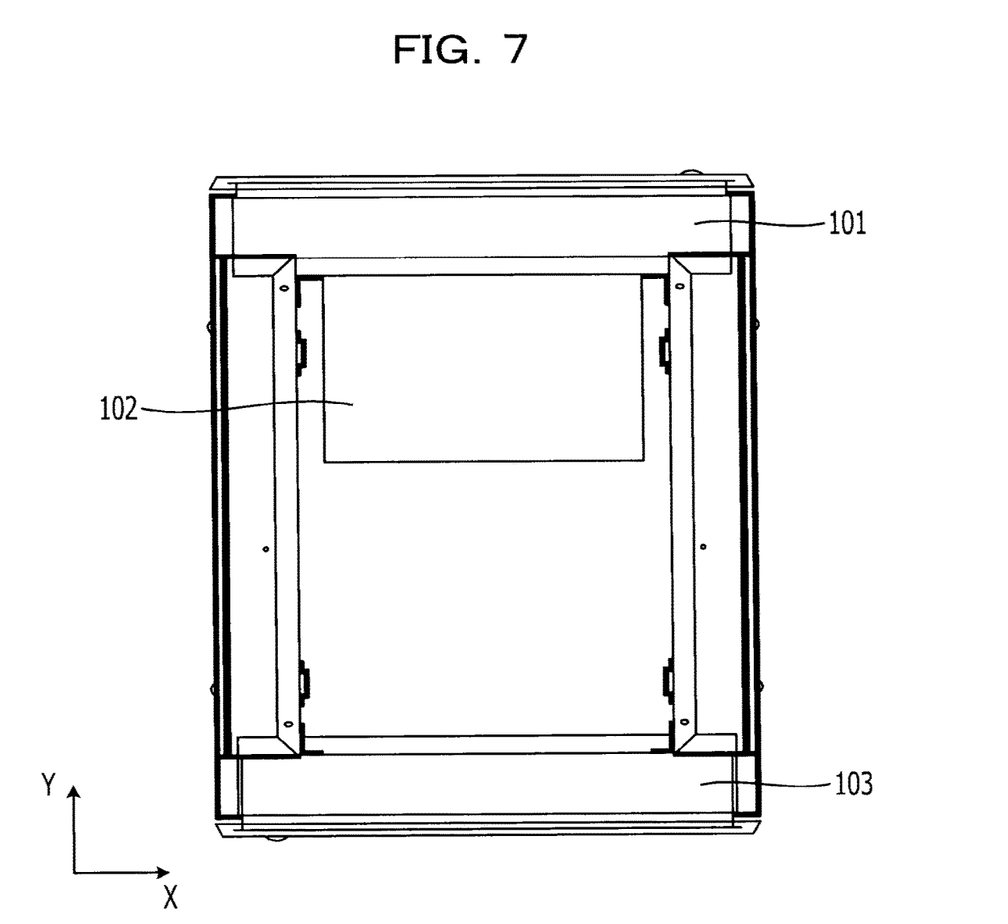
FIG. 7 is a sectional view taken along arrows A-A in FIG. 4.

FIG. 7 is a sectional view taken along arrows A-A in FIG. 4. As illustrated in FIGS. 4 and 7, the inlet 103 is provided in the front side of the housing 1. That is, the inlet 103 is a path that allows escape of air in a space where cool air discharged from the outlet 21 accumulates, the space being surrounded by the partition plate 10, the shielding plate 11, the air conditioner 2, and the housing 1. The inlet 103 has, for example, a rectangular opening having a width of 680 mm and a depth of 95 mm.

The outlet 101 is provided in the back side of the housing 1. The outlet 102 is provided in front of the outlet 101 and behind the shielding plate 11. That is, the outlet 101 and the outlet 102 are openings that allow entry of air into a space where warm air discharged from the electronic device 3 accumulates, the space being surrounded by the partition plate 10, the shielding plate 11, the air conditioner 2, and the housing 1. The outlet 102 has, for example, a rectangular opening having a width of 440 mm and a depth of 280 mm.

Figure 8:
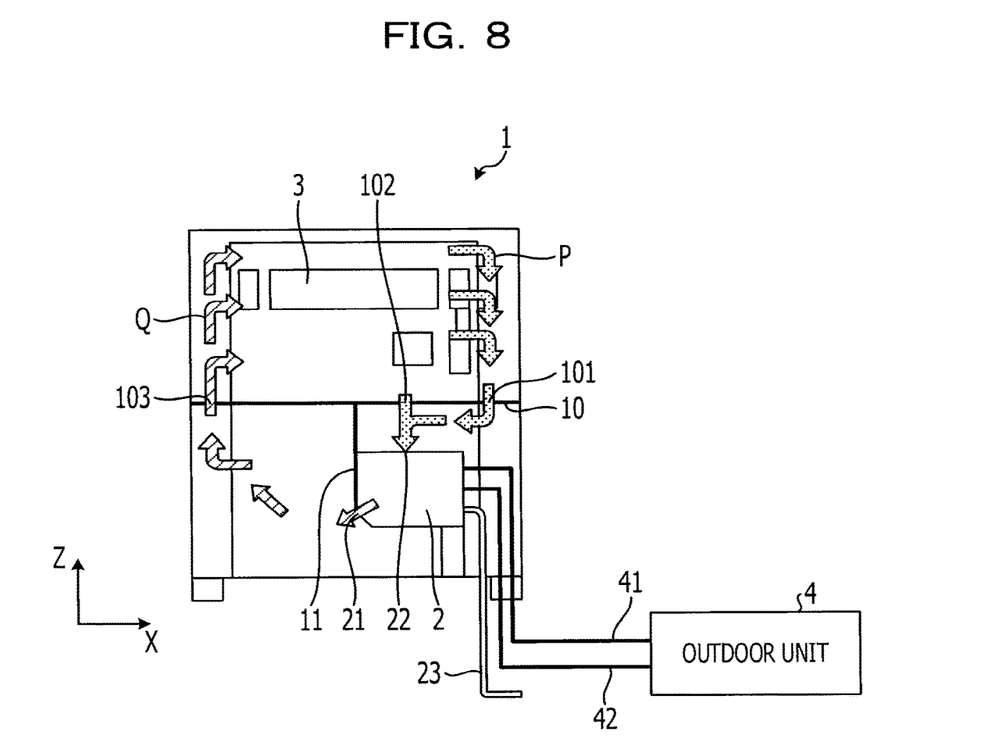
FIG. 8 illustrates an overall flow of air in the rack device according to the embodiment.

Next, with reference to FIG. 8, the overall flow of air in the rack device according to the embodiment will be described. FIG. 8 illustrates the overall flow of air in the rack device according to the embodiment. Arrows P that are dotted therein represent discharge from the electronic device 3. Arrows Q that are shaded with oblique lines therein represent suction by the electronic device 3.

Warm air discharged from the electronic device 3 passes through the outlet 101 and the outlet 102 and is sent into the lower space 14 from the upper space 13. The warm air sent to the lower space 14 is sucked by the air conditioner 2 from the inlet 22. The air conditioner 2 cools the sucked air and discharges the cooled air from the outlet 21. The cool air discharged from the outlet 21 passes through the inlet 103 and is sent into the upper space 13 from the lower space 14. Then, the cool air sent into the upper space 13 is sucked by the electronic device 3.

Figure 9:
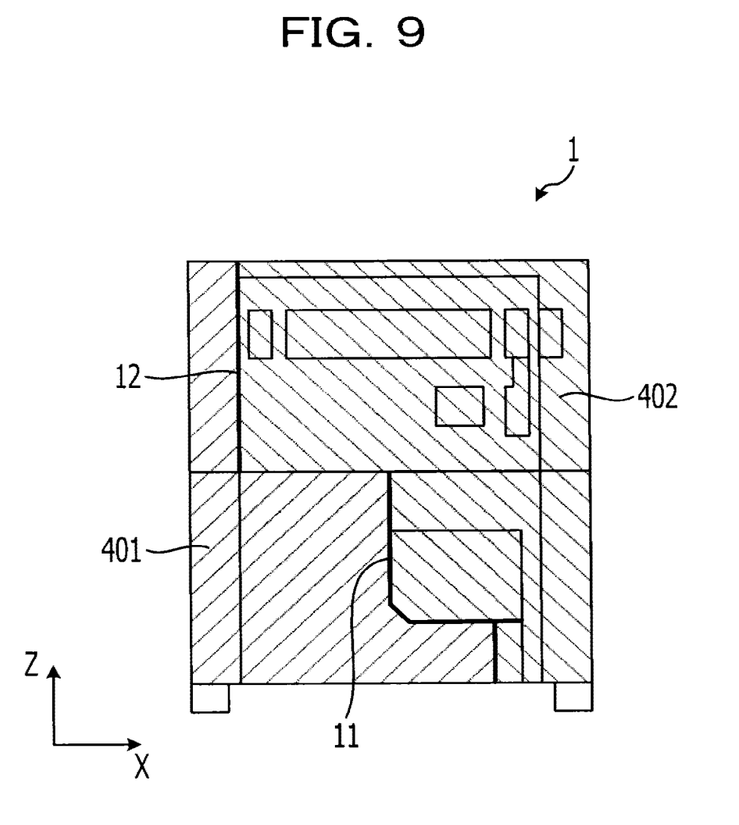
FIG. 9 illustrates a cold area and a hot area in the rack device according to the embodiment.

Further, with reference to FIG. 9, a cold area 401 where cool air accumulates and a hot area 402 where warm air accumulates in the rack device according to the embodiment will be described. FIG. 9 illustrates the cold area 401 and the hot area 402 in the rack device according to the embodiment. The rack device according to the embodiment is divided into the cold area 401 and the hot area 402 by dividing the space in the rack device by the side partition plates 12 and the shielding plate 11 that is attached to a portion along the front side of the air conditioner 2. The cold area 401 is an area that is shaded by oblique lines extending downward and leftward. The hot area 402 is an area that is shaded by oblique lines extending downward and rightward. As described above, the side partition plates 12 divide the space in the rack device so that cool air that is sucked by the electronic device 3 and air that is warmed by the electronic device 3 do not mix with each other. The shielding plate 11 divides the space in the rack device so that warm air that is sucked by the air conditioner 2 and cool air that is discharged from the air conditioner 2 do not mix with each other. Therefore, air in the cold area 401 and air in the hot area 402 do not mix with each other. This makes it possible to increase cooling efficiency of the air in the rack device by the air conditioner 2.

The side partition plates 12 that function as shielding plates at the front side of the housing 1 are mounted to a rack portion in the upper space 13 where the electronic device 3 is not provided. By this structure, at the rack portion where the electronic device 3 is not provided, it is possible to reduce the amount of air that moves through the front and back spaces in the interior of the housing 1. It is desirable that the side partition plates 12 be mounted along the front side of the electronic device 3 that is provided at the housing 1. This makes it possible to guide heat generated from the electronic device 3 itself to the hot area 402.

The housing 1 according to the embodiment is such that the position of a plane of each side partition plate 12 in the depth direction and the position of a front plane of the electronic device 3 in the depth direction are the same.

Further, as illustrated in FIG. 8, the indoor unit of the air conditioner 2 according to the embodiment is connected to the outdoor unit, disposed outside the housing 1, with the refrigerant pipes 41 and 42. Here, the outdoor unit of the air conditioner 2 is described as the outdoor unit 4. The refrigerant pipes 41 and 42 are formed of, for example, copper. In the embodiment, the outdoor unit 4 is disposed outside the office. The outdoor unit 4 is such that a compressor that converts low-pressure gas into high-pressure gas and a condenser that converts lower-pressure gas into high-pressure liquid are connected to each other with the refrigerant pipes 41 and 42; and the air conditioner 2 is such that an expander that converts high-pressure liquid into low-pressure liquid and an evaporator that converts high-pressure liquid into low-pressure gas are connected to each other with the refrigerant pipes 41 and 42, so that a mechanism for a cooling cycle is provided. At the condenser of the outdoor unit 4, when a coolant is converted from a gas into a liquid, heat is dissipated and is discharged to the outside; and, at the evaporator of the air conditioner 2, when a coolant is converted from a liquid into a gas, heat of air in a room is taken away and the air is cooled.

Further, returning to FIG. 3, the other capabilities of the rack device are described. Here, the air conditioner 2 is described by separately describing the outdoor unit and the indoor unit. The housing 1 is provided with an operation-indicating lamp 301 and an abnormality-indicating lamp 302. The operation-indicating lamp 301 turns on while the indoor unit of the air conditioner 2 operates. The abnormality-indicating lamp 302 turns on when an abnormality occurs in the indoor unit or the outdoor unit of the air conditioner 2. The term "abnormality" refers to a case in which the indoor unit or the outdoor unit of the air conditioner 2 determines that an abnormality has occurred in, for example, communication, a thermistor, a controlling section, a fan motor, or a cooling cycle.

Figure 10:
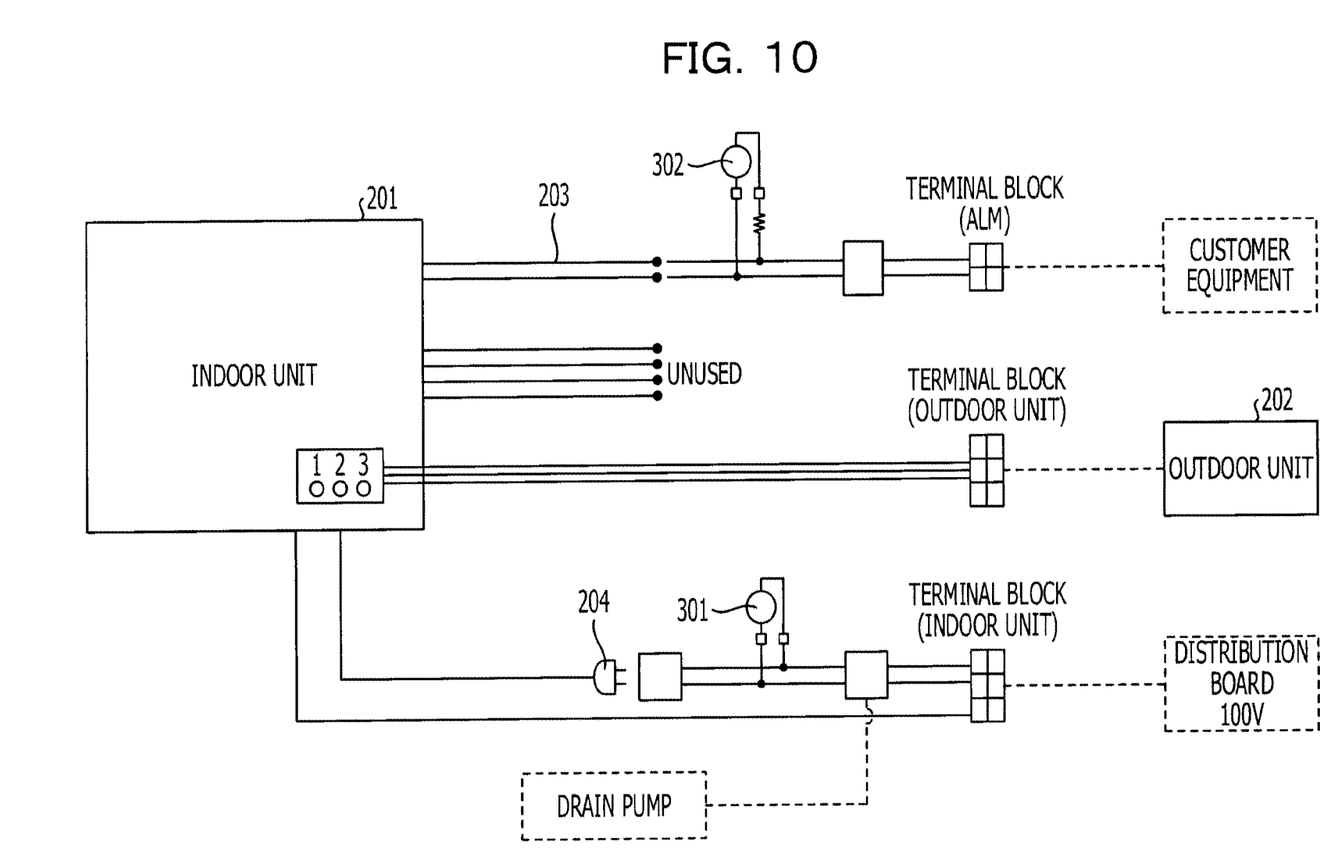
FIG. 10 is a schematic view of a connection between an abnormality-indicating lamp and an operation-indicating lamp.

Here, with reference to FIG. 10, the abnormality-indicating lamp 302 is described in detail. FIG. 10 is a schematic view of a connection between the abnormality-indicating lamp 302 and the operation-indicating lamp 301. In FIG. 10, the indoor unit and the outdoor unit of the air conditioner 2 are represented as an indoor unit 201 and an outdoor unit 202, respectively. The abnormality-indicating lamp 302 is connected to the indoor unit 201 of the air conditioner 2 with an abnormality output cable 203. The outdoor unit 202 is connected to the indoor unit 201. When any of the aforementioned abnormalities is detected, the indoor unit 201 causes an electric current to flow through the abnormality output cable 203. This causes the abnormality-indicating lamp 302 to turn on. By inserting a plug 204 of the indoor unit 201, the operation-indicating lamp 303 turns on.

In order to detect an abnormal temperature, it is desirable to install a temperature sensor in the interior of the rack device. For example, a temperature sensor 304 in FIG. 4 may be installed at a location near an inlet of the indoor unit of the air conditioner 2.

As described above, in the rack device according to the embodiment, the space where the outlet of the indoor unit of the air conditioner exists and the space where the inlet of the indoor unit of the air conditioner exists are divided by the shielding plate. By disposing such a shielding plate, even if space is provided around the indoor unit of the compact air conditioner, air warmed by the electronic device and air cooled by the air conditioner do not mix with each other. In addition, by the side partition plates on respective sides of the electronic device, the space around the electronic device is divided into a space where cool air accumulates and a space where warm air accumulates. Therefore, in the entire rack device, the cold area and the hot area are reliably separated from each other. This makes it possible to increase cooling effect while reducing the size of the rack device.

Modification

Although, in order to take measures against water leakage and to facilitate maintenance, the air conditioner 2 is disposed in the lower space 14 of the housing 1, the air conditioner 2 may be disposed in the upper space 13. Even if the air conditioner 2 is disposed in the upper space 13, it is desirable that the shielding plate 11 that divides the space where the outlet 21 of the air conditioner 2 exists and the space where the inlet 22 of the air conditioner 2 exists from each other be disposed in the upper space 13. When the air conditioner 2 is disposed in the upper space 13 in this way, warm air is moved upward and cool air is moved downward, so that it is possible to further increase cooling efficiency. That is, it is desirable to determine whether to dispose the air conditioner 2 in the upper space 13 or the lower space 14 depending upon which of the following factors a user considers important, that is, measures against water leakage, ease of maintenance, cooling efficiency, and so forth.

Although, in the embodiment, the air conditioner 2 is disposed at the back side of the lower space 14, the air conditioner 2 may also be disposed at the front side of the lower space 14. However, it is desirable that the space where cooled air is discharged from the outlet 21 be provided as appropriate in accordance with the position of the outlet 21 and an air discharge direction. When the volume of cool air that is sent into the upper space 13 is considered, it is desirable that a certain amount of space be provided.

Although, in the embodiment, an indoor unit of a type that is mounted vertically on a wall is described as the air conditioner 2, for example, an indoor unit of a type that is mounted obliquely on a wall may also be used. When the type that is mounted obliquely on a wall is used, it is possible to reduce the size of the rack device depending upon the structure of the rack device.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A rack device comprising:
   a housing at which an electronic device and an air conditioner that cools sucked air and discharges cooled air are installed;
   a partition plate that divides a space in the housing into a first space in which the electronic device is disposed and a second space in which the air conditioner is disposed;
   a shielding plate that divides the second space into a space which is coupled to a suction side of the electronic device in the first space and a space which is coupled to a discharge side of the electronic device in the first space; and
   cushioning material disposed at a surface of the shielding plate facing the air conditioner, wherein
   the shielding plate is movable and divides the second space into the space which is coupled to the suction side of the electronic device and the space which is coupled to the discharge side of the electronic device when the cushioning material is in contact with the shielding plate and the air conditioner.

2. The rack device according to claim 1, wherein
   the shielding plate is a plate member that extends into the second space from the partition plate in a direction of the air conditioner and that has a length that is equal to a length of the housing in a widthwise direction of the housing.

3. The rack device according to claim 2, wherein
   the shielding plate is arranged along a side surface of the air conditioner where the outlet of the air conditioner exists.

4. The rack device according to claim 2, wherein
   the shielding plate is disposed so as to contact a front portion of the air conditioner.

5. The rack device according to claim 1, wherein
   the partition plate has an opening near a suction-side end portion of the electronic device and an opening near a discharge-side end portion of the electronic device, when the electronic device is installed at the housing.

6. The rack device according to claim 5, wherein
   a size of the opening of the partition plate near the suction-side end portion of the electronic device is less than a size of the opening of the partition plate near the discharge-side end portion of the electronic device.

7. The rack device according to claim 1, wherein
   an end of the shielding plate is provided with a first fitting member, the end of the shielding plate being provided at a side towards which the shielding plate extends in a direction of the air conditioner,
   the end of the shielding plate contacts the partition plate when the shielding plate is rotated around an axis of the housing in a widthwise direction of the housing, and
   the partition plate is provided with a second fitting member at a location where the end of the shielding plate contacts the partition plate, the second fitting member being fitted to the first fitting member.

8. The rack device according to claim 1, further comprising:
   a side partition plate that is disposed in the first space of the housing, the side partition plate dividing a suction-side space and a discharge-side space of the electronic device.

9. The rack device according to claim 8,
   wherein the side partition plate is mounted along a front side of the electronic device.

10. A rack system comprising:
    an electronic device that includes a processor;
    an air conditioner that cools sucked air and discharges cooled air;
    a housing at which the electronic device and the air conditioner are installed;
    a partition plate that divides a space in the housing into a first space in which the electronic device is disposed and a second space in which the air conditioner is disposed;
    a shielding plate that divides the second space into a space which is coupled to a suction side of the electronic device in the first space and a space which is coupled to a discharge side of the electronic device in the first space; and
    cushioning material disposed at a surface of the shielding plate facing the air conditioner, wherein
    the shielding plate is movable and divides the second space into the space which is coupled to the suction side of the electronic device and the space which is coupled to the discharge side of the electronic device when the cushioning material is in contact with the shielding plate and the air conditioner.

* * * * *